US 11,125,697 B2

(12) United States Patent
Kobayashi et al.

(10) Patent No.: US 11,125,697 B2
(45) Date of Patent: Sep. 21, 2021

(54) TRANSFER STATE INSPECTION SYSTEM AND COMPONENT MOUNTER

(71) Applicant: FUJI CORPORATION, Chiryu (JP)

(72) Inventors: Takahiro Kobayashi, Chiryu (JP); Hiroshi Oike, Chiryu (JP); Kazuya Kotani, Toyota (JP)

(73) Assignee: FUJI CORPORATION, Chiryu (JP)

( * ) Notice: Subject to any disclaimer, the term of this patent is extended or adjusted under 35 U.S.C. 154(b) by 44 days.

(21) Appl. No.: 16/610,657

(22) PCT Filed: May 12, 2017

(86) PCT No.: PCT/JP2017/017999
§ 371 (c)(1),
(2) Date: Nov. 4, 2019

(87) PCT Pub. No.: WO2018/207339
PCT Pub. Date: Nov. 15, 2018

(65) Prior Publication Data
US 2020/0271592 A1    Aug. 27, 2020

(51) Int. Cl.
*G01N 21/88* (2006.01)
*H05K 13/08* (2006.01)
*G01B 11/22* (2006.01)

(52) U.S. Cl.
CPC ....... *G01N 21/8851* (2013.01); *H05K 13/083* (2018.08); *H05K 13/0817* (2018.08); *G01B 11/22* (2013.01)

(58) Field of Classification Search
CPC .............. G01N 21/8851; H05K 13/083; H05K 13/0817; G01B 11/22
See application file for complete search history.

(56) References Cited

U.S. PATENT DOCUMENTS

| | | | | |
|---|---|---|---|---|
| 5,761,337 A | * | 6/1998 | Nishimura | ........... G01R 31/303 382/150 |
| 2016/0100089 A1 | * | 4/2016 | Nozawa | ................ G06T 7/0004 348/95 |

FOREIGN PATENT DOCUMENTS

| EP | 0 935 135 A1 | 11/1999 |
|---|---|---|
| EP | 2 998 728 A1 | 3/2016 |

(Continued)

OTHER PUBLICATIONS

Partial Supplementary European Search Report dated Apr. 1, 2020 in corresponding European Patent Application No. 17909312.5, 14 pages.

*Primary Examiner* — Jamil Ahmed
(74) *Attorney, Agent, or Firm* — Oblon, McClelland, Maier & Neustadt, L.L.P.

(57) ABSTRACT

A transfer state inspection system including a camera configured to capture a transfer state of a transfer material of any of solder, flux, conductive paste, or adhesive transferred to multiple terminals on a lower surface of an electronic component; an image processing section configured to process an image captured by the camera to recognize the transfer state of the transfer material such that the transfer state inspection system inspects the transfer state of the transfer material based on a recognition result of the image processing section; an inspection target specifying section configured to specify whether inspection is necessary for at least a portion of the terminals among the multiple terminals on the lower surface of the electronic component via an operation from an operator or a production program; and an inspection executing section configured to not inspect the transfer state of the transfer material for terminals specified as unnecessary.

16 Claims, 4 Drawing Sheets

(56) References Cited

FOREIGN PATENT DOCUMENTS

| JP | 2008-216140 A | | 9/2008 | |
| JP | 2008216140 A | * | 9/2008 | ............. G01B 11/24 |

\* cited by examiner

TRANSFER STATE INSPECTION SYSTEM AND COMPONENT MOUNTER

TECHNICAL FIELD

The present specification discloses technology related to a component mounter and a transfer state inspection system for using image processing to inspect a transfer state of a transfer material of any of solder, flux, conductive paste, or adhesive transferred to multiple terminals on a lower surface of an electronic component.

BACKGROUND ART

For example, as described in patent literature 1 (JP-A-2008-216140), there is a known component mounter on which is set a transfer tank for storing a transfer material such as solder, wherein an electronic component supplied from a component supply device is picked up using a suction nozzle, multiple terminals on the lower surface of the electronic component are immersed in the transfer material in the transfer tank to transfer material to the multiple terminals, and then the electronic component is mounted on a circuit board, or the electronic component is mounted on a component already mounted on a circuit board in so-called package-on-package (PoP) mounting.

In this case, among multiple terminals on the lower surface of the electronic component, if there is one terminal for which the transfer state of the transfer material is defective (hereinafter simply referred to as "transfer defect"), the electronic component will result in a mounting defect, thus, the lower surface of the electronic component is imaged by a camera after the transfer, the transfer state of the transfer material is inspected for all terminals on the lower surface of the electronic component by image processing, and if it is determined that a transfer defect has occurred for any of the terminals, the electronic component is discarded or transfer is performed again, and only electronic components for which the transfer state of the transfer material is determined to be good (no transfer defect) for all terminals are mounted.

CITATION LIST

Patent Literature

Patent Literature 1: JP-A-2008-216140

BRIEF SUMMARY

Technical Problem

However, there are cases in which inspection of the transfer state of the transfer material (hereinafter simply referred to as "transfer inspection") is not stable due to various factors, and this may lower the inspection accuracy. For example, a difference in the shape of a terminal that is a target for transfer may be a factor that makes the transfer inspection unstable. In general, a relatively stable transfer inspection can be performed when all the terminals that are targets for transfer are round and of the same size, but when terminals of different shapes are mixed, for example, when round terminals and square terminals are mixed, the transfer inspection tends to be less stable for the square terminals compared to the round terminals. In addition, there is a possibility that a difference in the size of the terminal or the surface finish of the terminal becomes a factor, or a variation in the illumination state of each terminal due to a difference in the position of each terminal becomes a factor.

Therefore, if it is known in advance that the transfer inspection is not stable for some of the multiple terminals on the lower surface of the electronic component, the transfer inspection of the electronic component may not be performed. However, if the transfer inspection is not performed, since all of the electronic components, including those having a terminal with a transfer defect, are mounted, mounting defects due to transfer defects cannot be prevented at all. On the other hand, if all the terminals of electronic components having terminals for which the transfer inspection is not stable are subjected to transfer inspection in one go, the number of components to be discarded or for which transfer is to be performed again increases due to erroneous determination that a transfer defect occurred even when a transfer defect did not actually occur, which lowers productivity.

Solution to Problem

To solve the above problems, disclosed herein is a transfer state inspection system including: a camera configured to capture a transfer state of a transfer material of any of solder, flux, conductive paste, or adhesive transferred to multiple terminals on a lower surface of an electronic component; an image processing section configured to process an image captured by the camera to recognize the transfer state of the transfer material such that the transfer state inspection system inspects the transfer state of the transfer material based on a recognition result of the image processing section; an inspection target specifying section configured to specify whether inspection is necessary for at least a portion of the terminals among the multiple terminals on the lower surface of the electronic component via an operation from an operator or a production program; and an inspection executing section configured to not inspect the transfer state of the transfer material for terminals specified as unnecessary to be inspected by the inspection target specifying section among the multiple terminals on the lower surface of the electronic component, and to inspect the transfer state of the transfer material only for other terminals.

In this configuration, among the multiple terminals on the lower surface of the electronic component that are transfer targets, transfer inspection is not performed for the terminals specified as unnecessary to be inspected by an operation of an operation or the production program, and transfer inspection is performed only for the other terminals. When specifying whether transfer inspection is necessary, since it can be understood from an operator's experience, production results, or the like whether transfer inspection will be unstable based on the shape, size, position, shininess, and so on of the terminals, for example, among the multiple terminals on the lower surface of the electronic component, inspection may be specified as unnecessary for terminals for which the transfer inspection will be unstable, with stable transfer inspection being performed for the other terminals. Thus, even for electronic components for which transfer inspection itself had to be omitted because transfer inspection is not stable for a portion of the terminals, by excluding the portion of the terminals for which transfer inspection is not stable from the transfer inspection, it is possible to greatly reduce mounting defects due to transfer defects. Further, compared to a case that is similar to a conventional method in which transfer inspection is performed for all terminals of an electronic component that includes terminals for which transfer inspection is not stable, transfer inspection accuracy and reliability is improved, and it is possible to greatly reduce the quantity of components that are rejected or for which transfer is performed again due to an incorrect determination of a transfer defect when in fact there is no transfer defect.

Further, among the multiple terminals on the lower surface of the electronic component that are transfer targets, since it can be understood from an operator's experience, production results, or the like whether a terminal is relatively likely to have a transfer defect due to the shape, size, position, shininess, and so on of the terminals, for example, among the multiple terminals on the lower surface of the electronic component, inspection may be specified as unnecessary for a portion of the terminals that have a relatively low likelihood of having a transfer defect, and to improve the accuracy of the image processing of the transfer state of the transfer material for terminals other than these (that is, terminals relatively likely to have a transfer defect), imaging conditions such as the shutter speed of the camera, lighting conditions such as the lighting angle, lighting pattern, lighting amount, and so on, or image processing conditions such as an image processing algorithm or the like may be set, an image may be captured of the lower surface of the electronic component, and image processing performed on the image. By doing so, it is possible to improve the image recognition accuracy for terminals having a relatively high probability of occurrence of a transfer defect, thereby to perform stable transfer inspection, and improve the accuracy and reliability of the transfer inspection. In this case, if it can be confirmed by the transfer inspection that a transfer defect has not occurred for a terminal having a relatively high probability of occurrence of a transfer defect, it can be assumed with high confidence that a transfer defect has not occurred for terminals for which transfer inspection was not performed (that is, terminals having a relatively low probability of occurrence of a transfer defect).

When specifying whether inspection is necessary for at least a portion of the terminals among the multiple terminals on the lower surface of the electronic component that are transfer targets, it may be specified whether inspection is necessary for each terminal individually, or whether inspection is necessary may be specified collectively for each terminal elements with a defined terminal arrangement based on the shape, size, or pitch of the terminals. Alternatively, it is possible to collectively specify whether inspection is necessary by each size of terminal or for a terminal group classified by the shape and size of the terminal. Also, whether inspection is necessary may be specified for all terminals on the lower surface of an electronic component, or only for a portion of terminals for which transfer inspection is not stable. Alternatively, whether inspection is necessary may be specified only for a predetermined terminal element that includes a terminal for which transfer inspection is not stable, or for a predetermined terminal group, or for terminals within a predetermined size range. In each case, transfer inspection may be performed for all terminals for which whether inspection is necessary is not specified based on an operation of an operator or a production program.

Further, the configuration may include: an inspection conditions specifying section configured to specify inspection conditions used for inspecting the transfer state of the transfer material for at least a portion of the terminals among the multiple terminals on the lower surface of the electronic component via an operation from an operator or a production program; and an inspection executing section configured to, when inspecting the transfer state of the transfer material for the multiple terminals on the lower surface of the electronic component, inspect the transfer state of the transfer material under the inspection conditions specified for the specified terminals by the inspection conditions specifying section. By doing so, for example, the inspection conditions can be individually changed in accordance with the shape, size, position, shininess, and the like of the terminals, and transfer inspection can be performed on all the terminals of the electronic component with relatively high accuracy.

Here, inspection conditions that can be specified, for example, may be at least one of a threshold for determining whether the transfer state of the transfer material is acceptable, image processing conditions such as an image processing algorithm, imaging conditions such as a camera shutter speed, or lighting conditions such as a lighting angle, a lighting pattern, or a lighting amount.

When lighting conditions or imaging conditions of the camera are specified as inspection conditions, an image may be captured by the camera of the lower surface of the electronic component under each inspection condition, the image may be processed, and the transfer state of the transfer material of the terminals to be inspected may be recognized under the inspection conditions.

As inspection conditions, when specifying a threshold for determining whether a transfer state of a transfer material is acceptable, among the multiple terminals on the lower surface of the electronic component, for terminals for which there is a tendency to have a relatively low image recognition accuracy of the transfer state of the transfer material, by specifying the threshold to make it less likely that a transfer defect is determined, it is possible to reduce the quantity of components discarded or for which transfer is performed again due to an erroneous determination that a transfer defect occurred even when a transfer defect did not actually occur.

As inspection conditions, when specifying image processing conditions, camera imaging conditions, and lighting conditions, among the multiple terminals on the lower surface of the electronic component, for terminals for which there is a tendency to have a relatively low image recognition accuracy of the transfer state of the transfer material, by specifying the image processing conditions, camera imaging conditions, and lighting conditions to improve the image recognition accuracy of the transfer state of the transfer material, it is possible to reduce the quantity of components discarded or for which transfer is performed again due to an erroneous determination that a transfer defect occurred even when a transfer defect did not actually occur.

DESCRIPTION OF EMBODIMENTS

A first and a second embodiment are described below.

First Embodiment

A first embodiment will be described with reference to FIGS. 1 to 5. The configuration of the component mounter is described using FIGS. 1 to 3.

Figure 1:
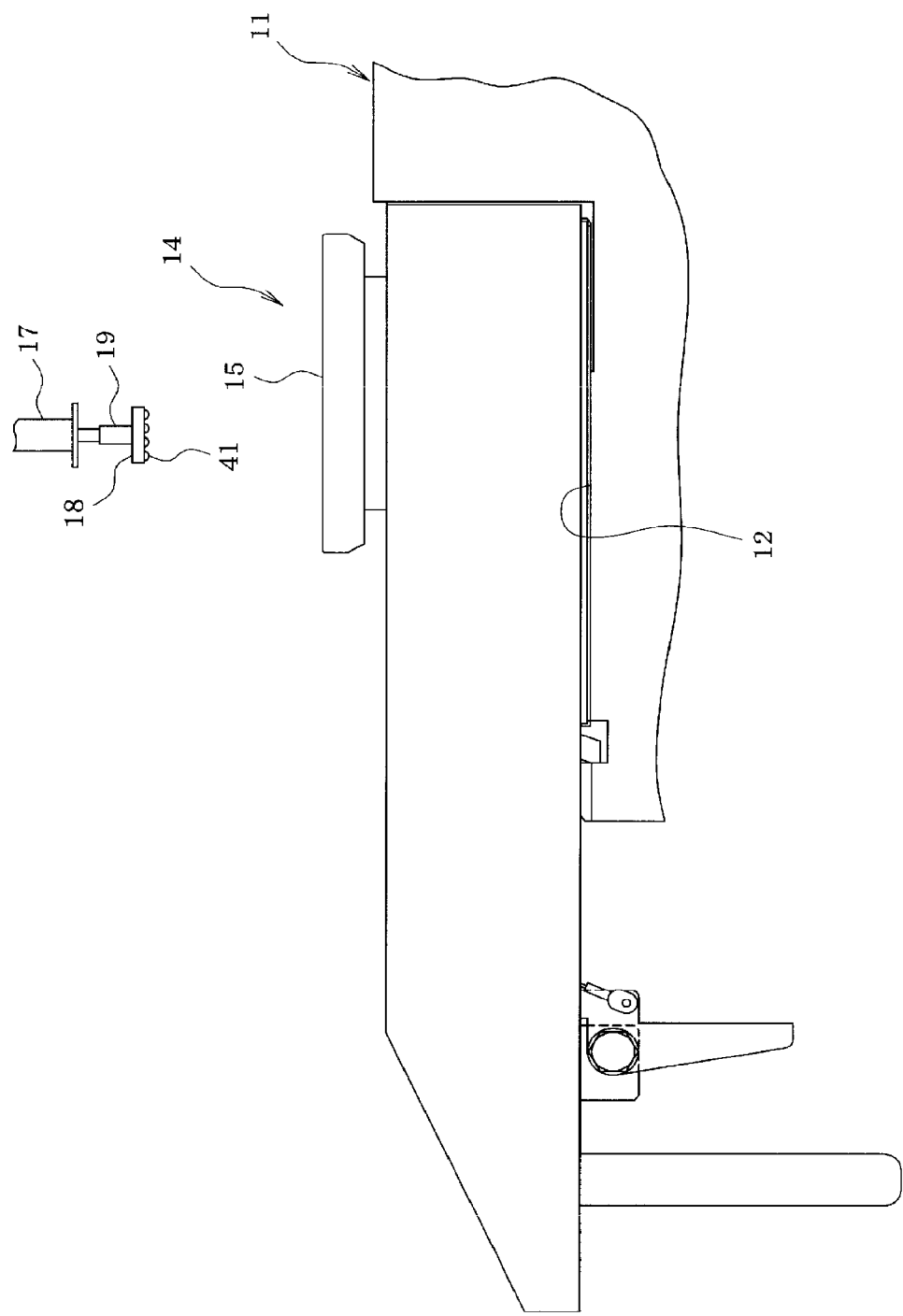
FIG. 1 is a side view showing a transfer device of a first embodiment set in a component mounter.
Figure 2:
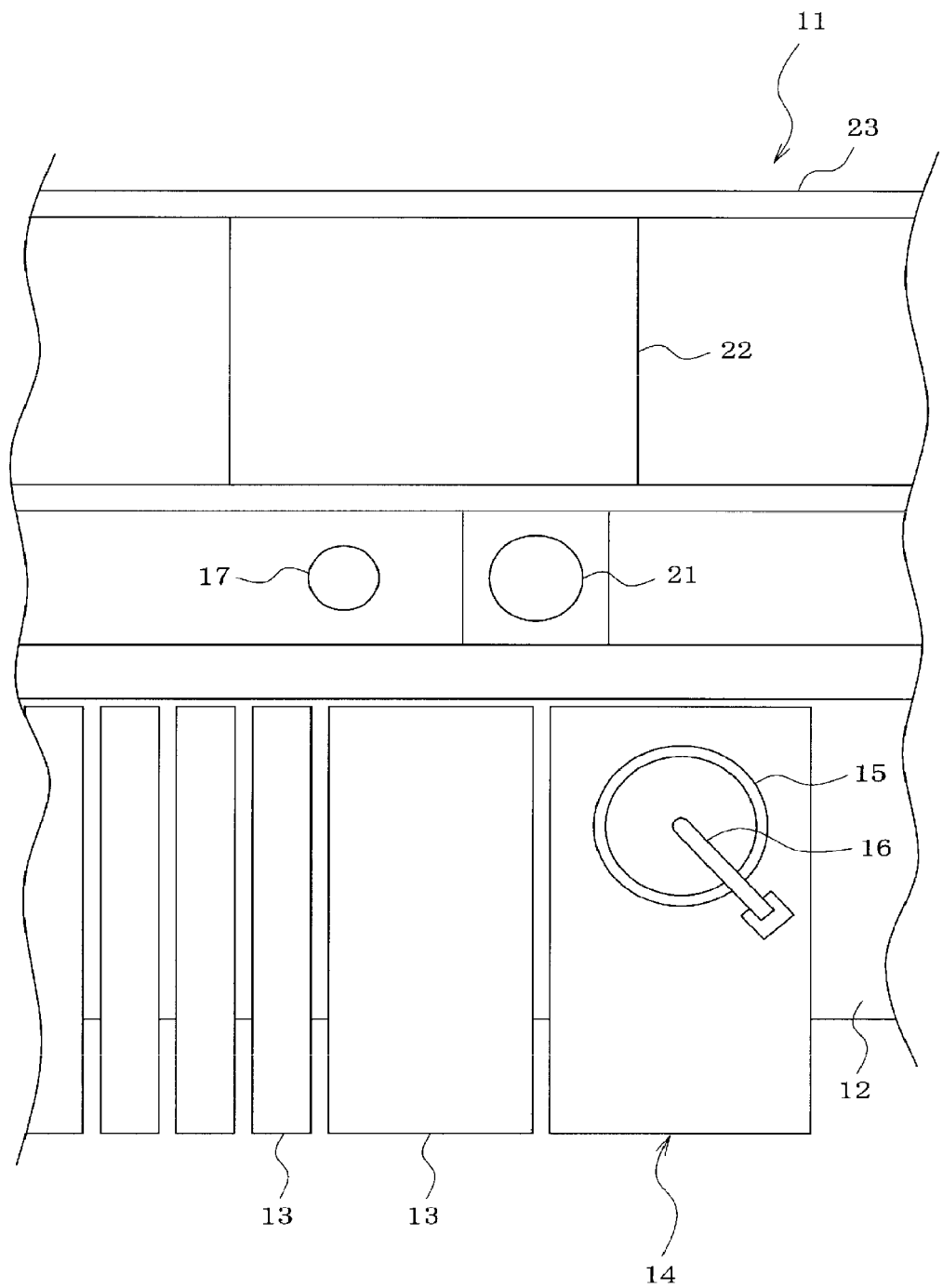
FIG. 2 is a plan view schematically showing the configuration of the main part of the component mounter.

As shown in FIG. 1 and FIG. 2, component supply devices 13 such as a tape feeder or tray feeder and a transfer device 14 are detachably set adjacent to each other on set table 12 of component mounter 11. Detachably mounted on transfer device 14 is a dish-shaped rotating table 15 (transfer tank) for forming a fluid transfer material of any of solder, flux, conductive paste, or adhesive into a film, and rotating table 15 is driven to rotate by a motor (not shown).

As shown in FIG. 2, provided above rotating table 15 is squeegee 16 with a length approximately equal to the radius of rotating table 15, squeegee 16 being provided along the radius direction of rotating table 15, and by the rotation of rotating table 15, transfer material inside rotating table 15 is uniformly spread by squeegee 16 and formed into a film.

Figure 4:
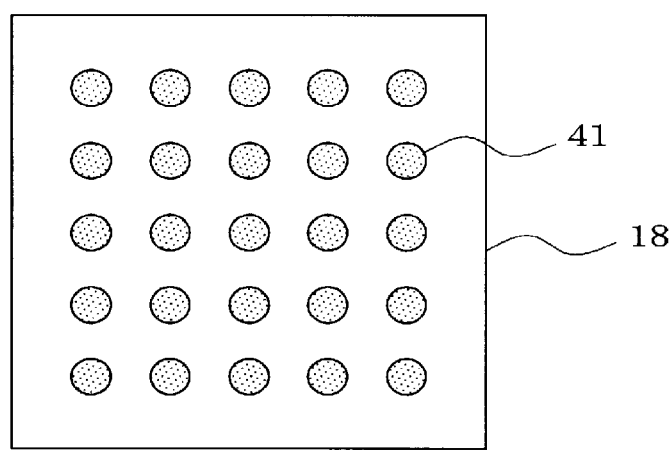
FIG. 4 is a bottom view of an electronic component for which the terminals are all the same shape.
Figure 5:
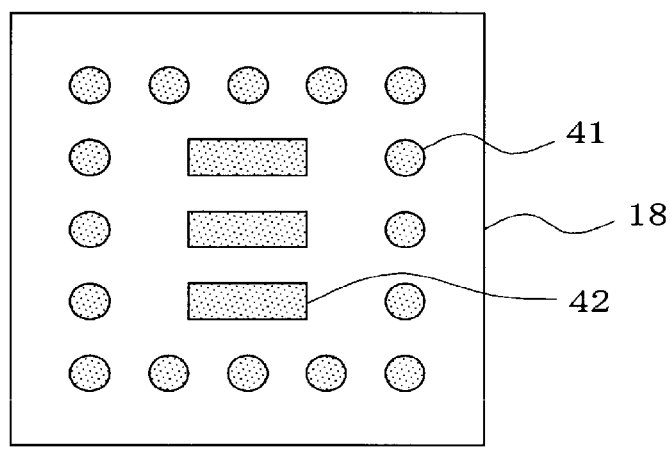
FIG. 5 is a bottom view of an electronic component in which differently shaped terminals are mixed.

As shown in FIG. 1, mounting head 17 of component mounter 11 exchangeably holds suction nozzle 19 that is for picking up electronic component 18 supplied from component supply device 13. During operation of component mounter 11, when an electronic component 18 held by suction nozzle 19 is a transfer target component (BGA component, chip component, etc.), the electronic component 18 is moved above rotating table 15 of transfer device 14 and then lowered such that multiple terminals 41 and 42 (see FIG. 4) on the lower surface of the electronic component 18 are immersed in the film of transfer material in rotating table 15 such that transfer material is transferred to the respective terminals 41 and 42. Among electronic components 18 to be transferred there are electronic components with terminals of various shapes, and, in addition to electronic components for which all the terminals are round (bumps) of the same size, there are electronic components in which terminals of different shapes are mixed. The electronic component 18 shown in FIG. 4 is an example in which all the terminals 41 are round terminals of the same size, and the electronic component 18 shown in FIG. 5 is an example in which round terminals 41 and quadrilateral terminals 42 are mixed.

As shown in FIG. 2, component mounter 11 is provided with camera 21 for capturing an image, from below, of the electronic component 18 held by suction nozzle 19 of mounting head 17, camera 21 being provided at a position below the path along which suction nozzle 19 moves. Conveyor 23 for conveying circuit board 22, mounting head moving device 24 (see FIG. 3) that moves mounting head 17 in the XY direction (the board conveyance direction and the direction perpendicular thereof), and the like are also provided on component mounter 11. On the other hand, mark imaging camera 25 (see FIG. 3) for imaging a reference position mark (not shown) of circuit board 22 is mounted on mounting head 17.

Figure 3:
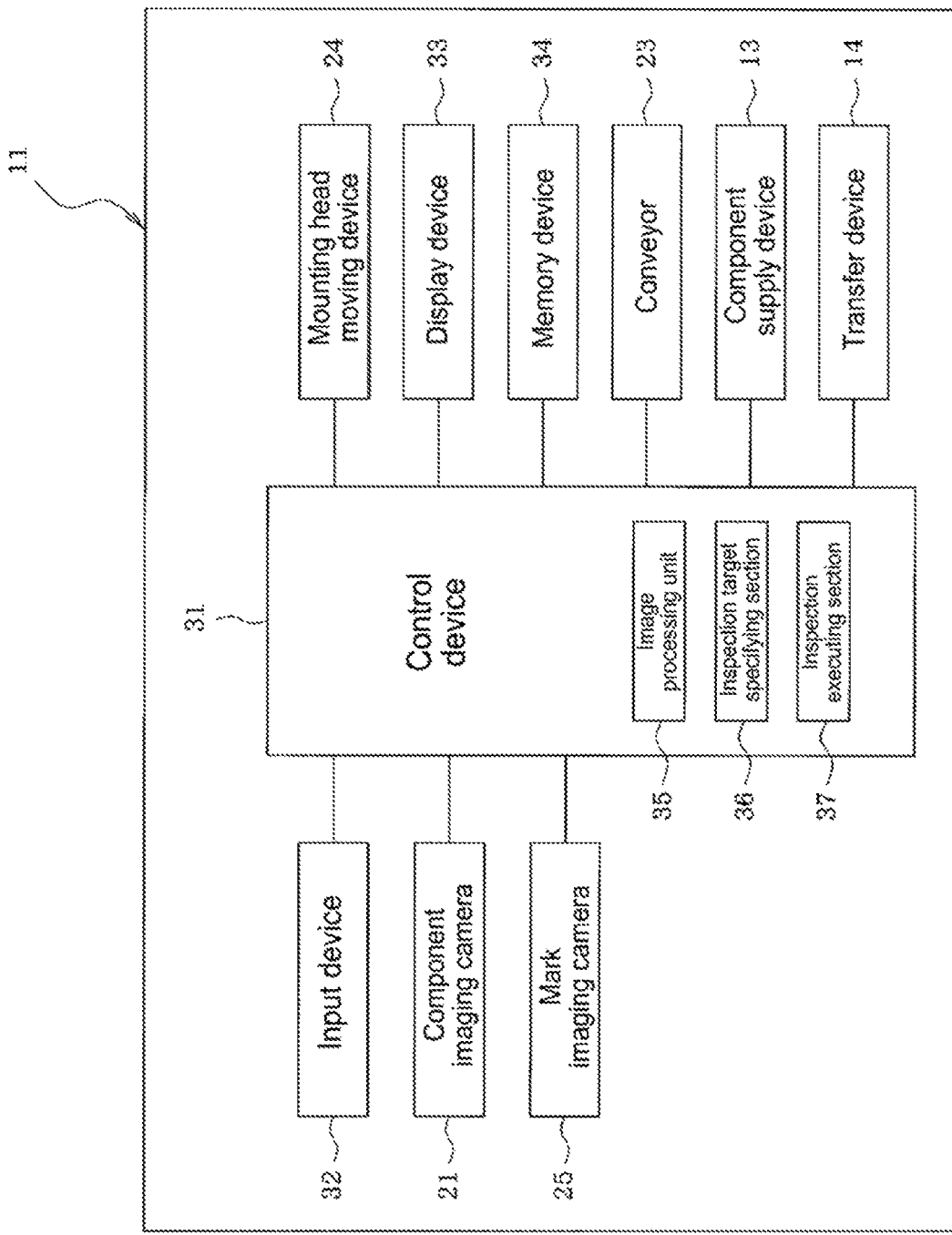
FIG. 3 is a block diagram showing the configuration of the control system of the component mounter.

As shown in FIG. 3, control device 31 of component mounter 11 is connected to input device 32 such as a keyboard, a mouse, and a touchscreen panel, display device 33 such as a liquid crystal display or a cathode ray tube (CRT), and memory device 34 for storing control programs and various data for controlling the operation of each part of component mounter 11. Further, image processing unit 35 that processes images captured by component imaging camera 21 and mark imaging camera 25 is embedded in control device 31. Image processing unit 35 also functions as an image processing section for processing an image of the lower surface of electronic component 18 captured by component imaging camera 21 and recognizing the transfer states of the transfer materials to terminals 41 and 42.

Control device 31 of component mounter 11 controls operation of picking up electronic component 18 supplied from component supply device 13 using suction nozzle 19 and mounting it on circuit board 22 during the operation of component mounter 11. Here, when the electronic component 18 held by suction nozzle 19 is a transfer target component such as a BGA component, the electronic component 18 held by suction nozzle 19 is moved above rotating table 15 of transfer device 14 and then lowered so as to transfer the transfer material to the terminals 41 and 42 on the lower surface of the electronic component 18, and then the electronic component 18 is mounted on circuit board 22 or an already-mounted component.

Further, control device 31 of component mounter 11 uses component imaging camera 21 to capture an image of the lower surface of the electronic component 18 held by suction nozzle 19 while moving the electronic component 18 above circuit board 22, uses image processing unit 35 to perform image processing, measures the amount of displacement of the pickup position of electronic component 18 in the X, Y, and θ directions (the positions of terminals 41 and 42), corrects the position of the electronic component 18 in the X, Y, and θ directions according to the amount of displacement of the pickup position, then mounts the electronic component 18 on circuit board 22 or the like. Here, when the electronic component 18 imaged by component imaging camera 21 is an electronic component to which transfer material has been transferred, control device 31 of component mounter 11 processes the image of the lower surface of the electronic component 18 imaged by component imaging camera 21 after the transfer using image processing unit 35, recognizes the transfer state of the transfer material to the respective terminals 41 and 42 of the electronic component 18, performs a transfer inspection of checking whether the transfer state of the transfer material to the respective terminals 41 and 42 is good based on the recognition result.

Any method may be used for this transfer inspection as long as it uses image processing. For example, the lower surface of electronic component 18 may be imaged by component imaging camera 21 before and after the transfer, and the brightness difference between the terminals 41 and 42 before and after the transfer may be measured to determine whether the transfer of the transfer material to the terminals 41 and 42 is good depending on whether the brightness difference is equal to or greater than predetermined thresholds. Alternatively, the brightness of each of the terminals 41 and 42 before transfer may be measured in advance by test-production or the like before starting production, and during production, the lower surface of the electronic component 18 may be imaged by the component imaging camera 21 after transfer, the brightness of each of the terminals 41 and 42 after transfer may be measured, and the brightness may be compared with a threshold to determine whether transfer material has been transferred to each of the terminals 41 and 42.

In this transfer inspection, if it is determined that the transfer is defective at any one of the multiple terminals 41 and 42 on the lower surface of the electronic component 18, the electronic component 18 is discarded or transfer is performed again, and only an electronic component for which the transfer state of the transfer material is determined to be good (no transfer defect) for all the inspected terminals 41 and 42 is mounted.

Note that, transfer inspection may not be stable due to various factors. For example, a difference in the shape of a terminal that is a target for transfer may be a factor that makes the transfer inspection unstable. As shown in FIG. 4, when all the terminals 41 that are transfer targets are round with the same size, it is possible to perform a relatively stable transfer inspection, but when terminals with different shapes are mixed, for example, when round terminals 41 and quadrilateral terminals 42 are mixed as shown in FIG. 5, there is a tendency that the transfer inspection is less stable for quadrilateral terminals 42 than for round terminals 41. In addition, there is a possibility that a difference in the size of the terminal or the surface finish of the terminal becomes a factor, or a variation in the illumination state of each terminal due to a difference in the position of each terminal becomes a factor.

Therefore, in the first embodiment, control device 31 of component mounter 11 functions as inspection target specifying section 36 configured to specify whether inspection is necessary for at least a portion of the terminals among the multiple terminals 41 and 42 on the lower surface of electronic component 18 via an operation from an operator or a production program, and inspection executing section 37 configured to not inspect the transfer state of the transfer material for terminals specified as unnecessary to be inspected by inspection target specifying section 36 among the multiple terminals 41 and 42 on the lower surface of electronic component 18, and to inspect the transfer state of the transfer material only for other terminals. As a result, the transfer inspection is not performed on a portion of the terminals 41 and 42 on the lower surface of electronic component 18 for which the transfer inspection is not stable, and the transfer inspection is performed only on the other terminals.

When the operator specifies whether the transfer inspection is necessary, the operator may specify the necessity of the transfer inspection by operating input device 32. When the production program specifies whether transfer inspection is necessary, information on whether transfer inspection is necessary for each type of electronic component for which transfer is to be performed may be registered in the production program in association with the terminal information when the production program is created.

When specifying whether transfer inspection is necessary, since it can be understood from an operator's experience, production results, or the like whether transfer inspection will be unstable based on the shape, size, position, shininess, and so on of the terminals, for example, among the multiple terminals on the lower surface of the electronic component, inspection may be specified as unnecessary for terminals for which the transfer inspection will be unstable, with stable transfer inspection being performed for the other terminals. For example, as shown in FIG. 5, with the electronic component 18 in which round terminals 41 and square terminals 42 are mixed, it is also possible to specify that transfer inspection is not necessary for square terminals 42 for which the transfer inspection is not stable, and to perform the transfer inspection only on round terminals 41.

Thus, even for electronic components for which transfer inspection itself had to be omitted because transfer inspection is not stable for a portion of the terminals, by excluding the portion of the terminals for which transfer inspection is not stable from the transfer inspection, it is possible to greatly reduce mounting defects due to transfer defects.

Further, compared to a case that is similar to a conventional method in which transfer inspection is performed for all terminals of an electronic component that includes terminals for which transfer inspection is not stable, transfer inspection accuracy and reliability is improved, and it is possible to greatly reduce the quantity of components that are rejected or for which transfer is performed again due to an incorrect determination of a transfer defect when in fact there is no transfer defect, thereby improving productivity.

Further, among the multiple terminals on the lower surface of the electronic component that are transfer targets, since it can be understood from an operator's experience, production results, or the like whether a terminal is relatively likely to have a transfer defect due to the shape, size, position, and so on of the terminals, for example, among the multiple terminals on the lower surface of the electronic component, inspection may be specified as unnecessary for a portion of the terminals that have a relatively low likelihood of having a transfer defect, and to improve the accuracy of the image processing of the transfer state of the transfer material for terminals other than these (that is, terminals relatively likely to have a transfer defect), imaging conditions such as the shutter speed of the camera, lighting conditions such as the lighting angle, lighting pattern, lighting amount, and so on, or image processing conditions such as an image processing algorithm or the like may be set, an image may be captured of the lower surface of the electronic component, and image processing performed on the image. By doing so, it is possible to improve the image recognition accuracy for terminals having a relatively high probability of occurrence of a transfer defect, thereby to perform stable transfer inspection, and improve the accuracy and reliability of the transfer inspection. In this case, if it can be confirmed by the transfer inspection that a transfer defect has not occurred for a terminal having a relatively high probability of occurrence of a transfer defect, it can be assumed with high confidence that a transfer defect has not occurred for terminals for which transfer inspection was not performed (that is, terminals having a relatively low probability of occurrence of a transfer defect).

When specifying whether inspection is necessary for at least a portion of the terminals among the multiple terminals on the lower surface of the electronic component that are transfer targets, it may be specified whether inspection is necessary for each terminal individually, or whether inspection is necessary may be specified collectively for terminals elements with a defined terminal arrangement based on the shape, size, or pitch of the terminals. Alternatively, it is possible to collectively specify whether inspection is necessary by each size of terminal or for a terminal group classified by the shape and size of the terminal. Accordingly, by collectively specifying whether inspection is necessary for each terminal element, each terminal group, and each size of terminal, even when an operator specifies whether inspection is necessary, it is possible to perform operation for specifying whether inspection is necessary simply and efficiently.

In this case, whether inspection is necessary may be specified for all terminals on the lower surface of an electronic component that are targets for transfer, or only for a portion of terminals for which transfer inspection is not stable (quadrilateral terminals 42 in the example of FIG. 5). Alternatively, whether inspection is necessary may be specified only for a predetermined (portion) terminal element that includes a terminal for which transfer inspection is not stable, or for a predetermined (portion) terminal group that includes a terminal for which transfer inspection is not stable, or for terminals within a predetermined (portion) size range that includes a terminal for which transfer inspection is not stable. In each case, transfer inspection may be performed for all terminals for which whether inspection is necessary is not specified based on an operation of an operator or a production program.

When image processing unit 35 processes the image of the lower surface of the electronic component captured by component imaging camera 21, control device 31 of component mounter 11, similar to as with terminals for which the transfer state of the transfer material is to be inspected, recognizes the position of each terminal of the terminals that are not to be inspected and uses those positions for mounting positioning, corrects the deviation of the mounting position of each terminal of the electronic component in the X, Y, and θ directions, and mounts the electronic component on circuit board 22 or the like. In this manner, even for an electronic component where the transfer states of the transfer material are not inspected for a portion of the terminals, mounting on circuit board 22 or the like can be performed with high accuracy.

Second Embodiment

A second embodiment is described below. However, for sections which are practically the same as the first embodiment, explanations are omitted or abbreviated, with descriptions largely given for sections which are different.

In the first embodiment above, whether inspection is necessary is specified for a portion of terminals among the multiple terminals on the lower surface of the electronic component that are targets for transfer, but in a second embodiment, it is possible to specify inspection conditions for inspecting the transfer state of transfer material for a portion of terminals among the multiple terminals on the lower surface of the electronic component that are targets for transfer.

In the second embodiment, control device 31 of component mounter 11 functions as: an inspection conditions specifying section configured to specify inspection conditions used for inspecting the transfer state of the transfer material for at least a portion of the terminals among the multiple terminals on the lower surface of the electronic component via an operation from an operator or a production program; and an inspection executing section configured to, when inspecting the transfer state of the transfer material for the multiple terminals on the lower surface of the electronic component, inspect the transfer state of the transfer material under the inspection conditions specified for the specified terminals by the inspection conditions specifying section. Here, when inspection conditions can be specified for only a portion of the multiple terminals on the lower surface of the electronic component that are targets for transfer, the transfer condition of the transfer material for the other terminals is inspected under predetermined inspection conditions set in advance.

When an operator specifies inspection conditions, the operator may specify the inspection conditions by operating input device 32. When the production program specifies the inspection conditions, information on the inspection conditions for each type of electronic component for which transfer is to be performed may be registered in the production program in association with the terminal information when the production program is created.

Here, inspection conditions that can be specified, for example, may be at least one of a threshold for determining whether the transfer state of the transfer material is acceptable, image processing conditions such as an image processing algorithm, imaging conditions such as a camera shutter speed, or lighting conditions such as a light angle, a lighting pattern, or a lighting amount.

When lighting conditions or imaging conditions of component imaging camera 21 are specified as inspection conditions, an image may be captured by component imaging camera 21 of the lower surface of the electronic component under each inspection condition, the image may be processed by image processing unit 35, and the transfer state of the transfer material of the terminals to be inspected may be recognized under the inspection conditions. For example, when transfer inspection is performed using two kinds of inspection conditions, the lower surface of the electronic component is imaged twice under different inspection conditions (different imaging conditions or lighting conditions) after the transfer, and image processing is performed twice.

As inspection conditions, when specifying a threshold for determining whether a transfer state of a transfer material is acceptable, among the multiple terminals on the lower surface of the electronic component, for terminals for which there is a tendency to have a relatively low image recognition accuracy of the transfer state of the transfer material, a threshold may be specified to make it less likely that a transfer defect is determined. By doing so, for terminals for which there is a tendency to have a relatively low image recognition accuracy of the transfer state of the transfer material, since a transfer defect is less likely to be determined, it is possible to reduce the quantity of components discarded or for which transfer is performed again due to an erroneous determination that a transfer defect occurred even when a transfer defect did not actually occur.

As inspection conditions, when specifying image processing conditions, and imaging conditions and lighting conditions of component imaging camera 21, among the multiple terminals on the lower surface of the electronic component, for terminals for which there is a tendency to have a relatively low image recognition accuracy of the transfer state of the transfer material, the image processing conditions, and the imaging conditions and lighting conditions of component imaging camera 21 may be specified to improve the image recognition accuracy of the transfer state of the transfer material. By doing this, for terminals for which there is a tendency to have a relatively low image recognition accuracy of the transfer state of the transfer material with a conventional method, since relatively accurate image recognition can be performed, it is possible to reduce the quantity of components discarded or for which transfer is performed again due to an erroneous determination that a transfer defect occurred even when a transfer defect did not actually occur.

When specifying whether inspection is necessary for at least a portion of the terminals among the multiple terminals on the lower surface of the electronic component that are transfer targets, inspection conditions may be specified for each terminal individually, or inspection conditions may be specified collectively for each terminal element with a defined terminal arrangement based on the shape, size, or pitch of the terminals. Alternatively, the inspection conditions may be specified collectively for each size of terminal or for each terminal group classified by the shape and size of the terminals. In this manner, if the inspection conditions can be collectively specified for each terminal element, each terminal group, and each terminal size, the inspection conditions can be specified by a simple operation even when the operator specifies the inspection conditions.

In this case, inspection conditions may be specified for all terminals on the lower surface of an electronic component that are targets for transfer, or only for a portion of terminals for which transfer inspection is not stable (quadrilateral terminals 42 in the example of FIG. 5). Alternatively, inspection conditions may be specified only for a predetermined terminal element that includes a terminal for which transfer inspection is not stable, or for a predetermined terminal group that includes a terminal for which transfer inspection is not stable, or for terminals within a predetermined size range that includes a terminal for which transfer inspection is not stable. In each case, transfer inspection may be performed under predetermined inspection conditions which are set in advance for the terminals for which the inspection conditions have not been specified by operation of an operator or the production program.

In the second embodiment described above, by individually changing the inspection conditions in accordance with the shape, size, position, shininess, and the like of the terminals of the electronic component that are targets for transfer, transfer inspection can be performed on all the terminals of the electronic component with relatively high accuracy, and the same effects as with the first embodiment can be obtained.

Note that, the present disclosure is not limited to the above first and second embodiments, and a combination of the first and second embodiments may be carried out.

Further, it is needless to say that the present disclosure can be implemented by various modifications within a range that does not deviate from the gist of the disclosure, such as changing the configuration of transfer device 14, or providing a camera dedicated to transfer inspection separately from component imaging camera 21.

REFERENCE SIGNS LIST

11: component mounting apparatus;
12: setting table;
13: component supply device;
14: transfer device;
15: rotating table (transfer tank);
16: squeegee;
17: mounting head;
18: electronic component;
19: suction nozzle;
21: component imaging camera;
22: circuit board;
32: input device;
35: image processing unit (image processing section);
36: inspection target specifying section;
37: inspection executing section;
41, 42: terminal

The invention claimed is:

1. A transfer state inspection system comprising:
a camera configured to capture a transfer state of a transfer material of any of solder, flux, conductive paste, or adhesive transferred to multiple terminals on a lower surface of an electronic component;
an image processing section configured to process an image captured by the camera to recognize the transfer state of the transfer material such that the transfer state inspection system inspects the transfer state of the transfer material based on a recognition result of the image processing section;
an inspection target specifying section configured to specify via an operation from an operator or a production program a first portion of the terminals among the multiple terminals on the lower surface of the electronic component as necessary to be inspected and to specify a second portion of the terminals among the multiple terminals on the lower surface of the electronic component as unnecessary to be inspected; and
an inspection executing section configured to not inspect the transfer state of the transfer material for the second portion of terminals, and to inspect the transfer state of the transfer material for the first portion of the terminals.

2. The transfer state inspection system according to claim 1, wherein
the inspection target specifying section is configured to specify whether each of the terminals is in the first portion of the terminals or the second portion of the terminals.

3. The transfer state inspection system according to claim 1, wherein
the inspection target specifying section is configured to specify whether each of the terminals is in the first portion of the terminals or the second portion of the terminals based on a shape, size, and pitch of the terminals.

4. The transfer state inspection system according to claim 1, wherein
the inspection target specifying section is configured to specify whether each of the terminals is in the first portion of the terminals or the second portion of the terminals by the shape and size of the terminal.

5. The transfer state inspection system according to claim 1, wherein
the inspection target specifying section is configured to specify terminals within a predetermined size range are in the first portion of the terminals.

6. The transfer state inspection system according to claim 1, wherein
the image processing section is configured to recognize a position of each terminal in the second portion of terminals, and use the recognized position for determining a mounting position.

7. A transfer state inspection system comprising:
a camera configured to capture a transfer state of a transfer material of any of solder, flux, conductive paste, or adhesive transferred to multiple terminals on a lower surface of an electronic component;
an image processing section configured to process an image captured by the camera to recognize a transfer state of the transfer material such that the transfer state inspection system inspects the transfer state of the transfer material based on a recognition result of the image processing section;
an inspection conditions specifying section configured to specify inspection conditions used for inspecting the transfer state of the transfer material for a first portion of the terminals among the multiple terminals on the lower surface of the electronic component via an operation from an operator or a production program; and
an inspection executing section configured to, when inspecting the transfer state of the transfer material for the multiple terminals on the lower surface of the electronic component, inspect the transfer state of the transfer material under the inspection conditions specified for the first portion of the terminals by the inspection conditions specifying section and to not inspect the transfer material for a second portion of the terminals among the multiple terminals.

8. The transfer state inspection system according to claim 7, wherein
the inspection conditions specifying section is configured to specify the inspection conditions for each of the terminals.

9. The transfer state inspection system according to claim 7, wherein
the inspection conditions specifying section is configured to collectively specify the inspection conditions for a predetermined terminal element or each terminal element with a defined terminal arrangement based on a shape, size, and pitch of the terminals.

10. The transfer state inspection system according to claim 7, wherein
the inspection conditions specifying section is configured to collectively specify the inspection conditions for a predetermined element group or each terminal group classified by the shape and size of the terminal.

11. The transfer state inspection system according to claim 7, wherein
the inspection conditions specifying section is configured to collectively specify the inspection conditions for each size of terminal or for terminals within a predetermined size range.

12. The transfer state inspection system according to claim 7, wherein
the inspection conditions that may be specified by the inspection conditions specifying section are a threshold value that determines whether the transfer state of the transfer material is good.

13. The transfer state inspection system according to claim 7, wherein
the inspection conditions that may be specified by the inspection conditions specifying section are image processing conditions used by the image processing section.

14. The transfer state inspection system according toc claim 7, wherein
the inspection conditions that may be specified by the inspection conditions specifying section are at least one of imaging conditions or lighting conditions of the camera, and
the image processing section is configured to capture an image of the lower surface of the electronic component for each of the inspection conditions, process that image, and recognize the transfer state of the transfer material of the first portion of the terminals under those inspection conditions.

15. The transfer state inspection system according to claim 7, wherein
the inspection conditions specifying section is configured to specify predetermined inspection conditions that are set in advance for terminals for which inspection conditions have not been specified by operation of an operator or the production program.

16. A component mounter comprising:
a transfer tank configured to accommodate a transfer material that is any of solder, flux, conductive paste, or adhesive, the component mounter being configured to immerse multiple terminals provided on a lower surface of an electronic component held by a suction nozzle in the transfer material in the transfer tank to transfer the transfer material onto the multiple terminals; and
a transfer state inspection system including
a camera configured to capture a transfer state of the transfer material a lower surface of the electronic component;
an image processing section configured to process an image captured by the camera to recognize the transfer state of the transfer material such that the transfer state inspection system inspects the transfer state of the transfer material based on a recognition result of the image processing section;
an inspection target specifying section configured to specify via an operation from an operator or a production program a first portion of the terminals among the multiple terminals on the lower surface of the electronic component as necessary to be inspected and to specify a second portion of the terminals among the multiple terminals on the lower surface of the electronic component as unnecessary to be inspected; and
an inspection executing section configured to not inspect the transfer state of the transfer material for the second portion of terminals, and to inspect the transfer state of the transfer material for the first portion of the terminals, wherein
the camera is a component imaging camera used for imaging from below the electronic component held by the suction nozzle.

* * * * *